(12) United States Patent
He et al.

(10) Patent No.: US 9,293,345 B2
(45) Date of Patent: Mar. 22, 2016

(54) SIDEWALL IMAGE TRANSFER WITH A SPIN-ON HARDMASK

(71) Applicant: GLOBALFOUNDRIES INC., Grand Cayman (KY)

(72) Inventors: Hong He, Schenectady, NY (US);
Chiahsun Tseng, Wynantskill, NY (US);
Chun-Chen Yeh, Clifton Park, NY (US);
Yunpeng Yin, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 278 days.

(21) Appl. No.: 13/968,807

(22) Filed: Aug. 16, 2013

(65) Prior Publication Data

US 2015/0048429 A1    Feb. 19, 2015

(51) Int. Cl.
| | | |
|---|---|---|
| *H01L 21/302* | (2006.01) | |
| *H01L 21/311* | (2006.01) | |
| *H01L 29/78* | (2006.01) | |
| *H01L 21/308* | (2006.01) | |
| *H01L 29/417* | (2006.01) | |
| *H01L 29/08* | (2006.01) | |
| *H01L 21/8234* | (2006.01) | |
| *H01L 21/8238* | (2006.01) | |
| *H01L 21/84* | (2006.01) | |

(Continued)

(52) U.S. Cl.
CPC ...... *H01L 21/31111* (2013.01); *H01L 21/3086* (2013.01); *H01L 29/785* (2013.01); *H01L 21/823431* (2013.01); *H01L 21/823821* (2013.01); *H01L 21/845* (2013.01); *H01L 27/0924* (2013.01); *H01L 29/0886* (2013.01); *H01L 29/41791* (2013.01); *H01L 29/66795* (2013.01)

(58) Field of Classification Search
CPC ............ H01L 21/0338; H01L 21/0337; H01L 21/311; H01L 21/31111; H01L 21/31122; H01L 21/31144; H01L 21/31; H01L 21/4757; H01L 21/47573
USPC ..................... 216/11; 257/E21.235, E21.236; 438/734, 736, 739
See application file for complete search history.

(56) References Cited

U.S. PATENT DOCUMENTS

| | | | |
|---|---|---|---|
| 7,470,570 B2 | 12/2008 | Beintner et al. | |
| 7,585,614 B2 | 9/2009 | Furukawa et al. | |
| 7,625,790 B2 | 12/2009 | Yang | |

(Continued)

OTHER PUBLICATIONS

Carlson et al., "Negative and iterated spacer lithography processes for low variability and ultra-dense integration" Proc. of SPIE, vol. 6924, Mar. 2008, 69240B. (9 pages).

(Continued)

*Primary Examiner* — Ha Tran T Nguyen
*Assistant Examiner* — Aaron Dehne
(74) *Attorney, Agent, or Firm* — Anthony Canale; Hoffman Warnick LLC

(57) ABSTRACT

Semiconductor devices and sidewall image transfer methods with a spin on hardmask. Methods for forming fins include forming a trench through a stack of layers that includes a top and bottom insulator layer, and a layer to be patterned on a substrate; isotropically etching the top and bottom insulator layers; forming a hardmask material in the trench to the level of the bottom insulator layer; isotropically etching the top insulator layer; and etching the bottom insulator layer and the layer to be patterned down to the substrate to form fins from the layer to be patterned.

16 Claims, 8 Drawing Sheets

(51) Int. Cl.
H01L 27/092 (2006.01)
H01L 29/66 (2006.01)

(56) References Cited

U.S. PATENT DOCUMENTS

| | | | |
|---|---|---|---|
| 7,947,589 B2 | 5/2011 | Muralidhar et al. | |
| 8,030,218 B2 | 10/2011 | Zhu | |
| 8,084,190 B2 | 12/2011 | Gutsche et al. | |
| 2004/0174655 A1 | 9/2004 | Tsai et al. | |
| 2005/0121412 A1* | 6/2005 | Beintner | H01L 21/3086 216/11 |
| 2007/0020879 A1 | 1/2007 | Baek et al. | |
| 2009/0166701 A1 | 7/2009 | Doyle et al. | |
| 2011/0092043 A1 | 4/2011 | Brodsky et al. | |
| 2012/0100673 A1 | 4/2012 | Shieh et al. | |
| 2012/0132616 A1 | 5/2012 | Barnola et al. | |
| 2012/0146157 A1 | 6/2012 | Baumgartner et al. | |
| 2012/0223418 A1* | 9/2012 | Stowers | C23C 18/06 257/632 |
| 2012/0244711 A1 | 9/2012 | Yin et al. | |
| 2012/0280283 A1 | 11/2012 | Cheng et al. | |
| 2012/0302057 A1 | 11/2012 | Arnold et al. | |
| 2013/0323652 A1* | 12/2013 | Fernandez | G03F 7/20 430/324 |
| 2014/0239418 A1* | 8/2014 | Wang | H01L 21/02304 257/411 |

OTHER PUBLICATIONS

Joseph et al., "Advanced plasma etch for the 10nm node and beyond" Proc. of SPIE, vol. 8685, Feb. 2013, 86850A. (8 pages).
International Search Report and Written Opinion of the International Searching Authority. Issued for International Application No. PCT/US14/51124. Jan. 2015. (12 pages).

* cited by examiner

SIDEWALL IMAGE TRANSFER WITH A SPIN-ON HARDMASK

BACKGROUND

1. Technical Field

The present invention relates to semiconductor device fabrication and, more particularly, to forming structures with sidewall image transfer using a spin-on hardmask.

2. Description of the Related Art

With current immersion lithographic techniques using 193 nm light, a minimum pitch size between features is about 80 nm. Techniques such as sidewall image transfer allow the formation of structures below the 80 nm. In conventional SIT, sidewalls are formed around one or more mandrel structures on a surface. The mandrels are then removed, leaving the sidewalls standing free on the surface. This allows the sidewalls themselves to be used to be used as a mask for further processing, allowing the creating of features with widths substantially smaller than the minimum size allowed by a given lithographic process. However, conventional SIT processes are limited in the density of structures that they can produce. While SIT can be performed multiple times, patterning costs increase and overlay rules grow more complicated as additional pattern cycles are introduced.

SUMMARY

A method for forming fins includes forming a trench through a stack of layers that includes a top and bottom insulator layer, and a layer to be patterned on a substrate; isotropically etching the top and bottom insulator layers; forming a hardmask material in the trench to the level of the bottom insulator layer; isotropically etching the top insulator layer; and etching the bottom insulator layer and the layer to be patterned down to the substrate to form fins from the layer to be patterned.

A method for forming fins includes forming a trench through a stack of layers that includes a top and bottom insulator layer, and a layer to be patterned on a substrate; forming a hardmask material in the trench to the level of the layer to be patterned; isotropically etching the top and bottom insulator layers; forming a hardmask material in the trench to the level of the bottom insulator layer; isotropically etching the top insulator layer; etching the bottom insulator layer and the layer to be patterned down to the substrate to form fins from the layer to be patterned; and repeating said steps of forming hardmask material and isotropically etching until a predetermined number of fins have been formed.

A semiconductor device includes a first and a second set of parallel fins, each set of fins having a same number of fins and a pitch between adjacent fins below a minimum pitch of an associated lithography process, wherein a spacing between the first and second set of fins is greater than the pitch between adjacent fins; a gate structure over the first and second sets of fins; a merged source region that connects the first and second sets of fins on a first side of the gate structure; and a merged drain region that connects the first and second sets of fins on a second side of the gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
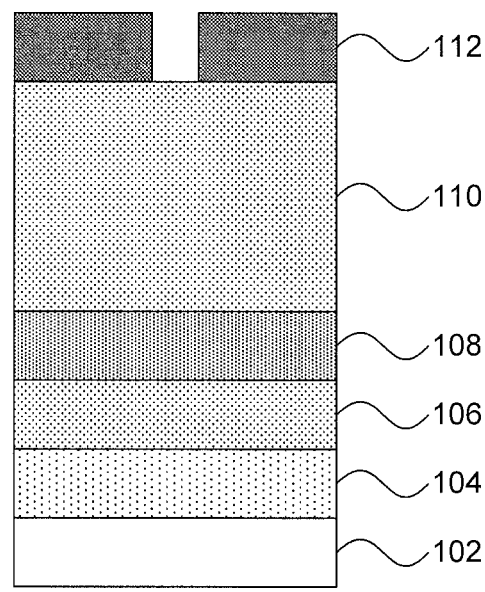
FIG. 1 is a cross-sectional view of a step in forming high-density fin structures in accordance with the present principles.

Embodiments of the present principles employ density multiplication for chip structures by manipulating the material deposition and etching processes. Using etch selectivity between different materials, the pattern density can be carefully manipulated. Embodiments of the present invention use only a single lithography process, with all subsequent pattern density increases being self-aligned with minimal overlay error. Furthermore, multiple critical pitches can be created without losing self-alignment, where a "critical pitch" is a minimum pitch on a specific technology node. Pattern density increases are performed through spin-on metal material deposition and dielectric material pull back.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a step in producing high-density structures is shown. A lithographic mask 112 is formed on top of a stack of layers. A substrate 102 on the bottom may be a semiconductor-on-insulator, a bulk semiconductor, or any other material to be patterned. In one example, the substrate is a bulk silicon substrate. A masking layer 104 is on top of the substrate 102 and may be formed from, e.g., titanium nitride. A first dielectric layer 106 on top of the masking layer 104 may be formed from, e.g., silicon dioxide or any other appropriate dielectric material. A hardmask layer 108 is formed on the first dielectric layer 106 and may be formed from any appropriate material including, e.g., a nitride. A second dielectric layer 110 is formed on the hardmask layer 108 and should be formed from the same dielectric material used for the first dielectric layer 106. The lithographic mask 112 is formed on top of the second dielectric layer 110 and may be formed from any appropriate masking material, depending on the lithographic process used. A trench is formed in the lithographic mask 112 using an appropriate lithographic process. In one exemplary embodiment, the trench may be formed using a lithographic process that has a minimum pitch size of 80 nm, resulting in a trench that is 80 nm across.

Figure 2:
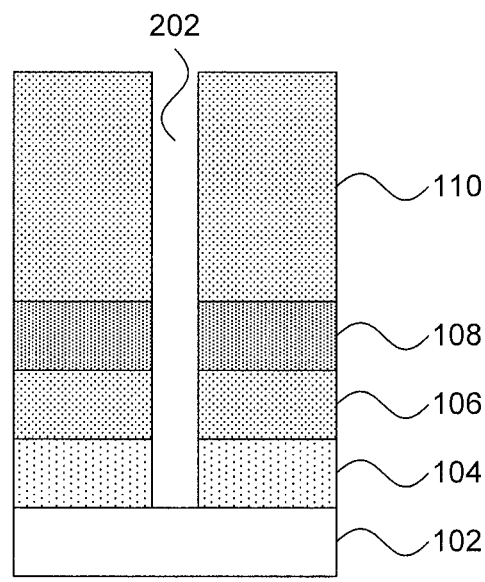
FIG. 2 is a cross-sectional view of a step in forming high-density fin structures in accordance with the present principles.

Referring now to FIG. 2, a step in producing high-density structures is shown. The trench in lithographic mask 112 is etched down into the underlying layers, forming trench 202. The trench extends down to the substrate layer 102. This etch may be performed using any appropriate anisotropic etch that selectively etches vertically and has zero, or minimal, transverse etching. Furthermore, the etch should penetrate multiple layers. One exemplary form of etch that may be employed is reactive ion etching. The lithographic mask 112 may be removed before or after the etch is performed.

Figure 3:
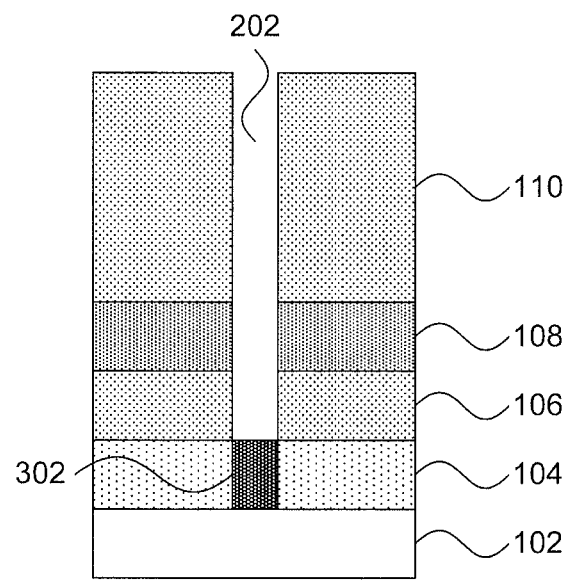
FIG. 3 is a cross-sectional view of a step in forming high-density fin structures in accordance with the present principles.

Referring now to FIG. 3, a step in producing high-density structures is shown. A metal hardmask 302 is spun on to fill the trench 202 and etched back to the level of masking layer 104. The hardmask 302 itself may be an inorganic photoresist including, e.g., hafnium oxide, which has a high chemical stability compared to polymer-based photoresists. The hardmask 302 is deposited by spin-coating sol-gel, which is a process that converts monomers into a colloidal solution that acts as a precursor for a network of particles or polymers. The hardmask 302 enables patterning small features with a high aspect ratio. Etches of the hardmask 302 can be performed using a $SiF_6/O_2$ plasma.

Figure 4:
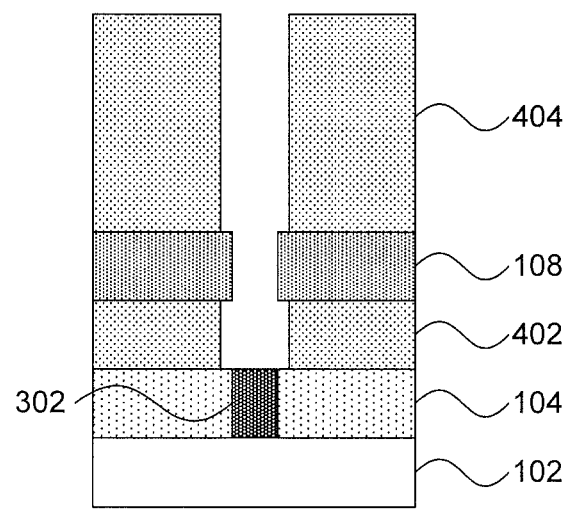
FIG. 4 is a cross-sectional view of a step in forming high-density fin structures in accordance with the present principles.

Referring now to FIG. 4, a step in producing high-density structures is shown. Chemical oxide removal is performed that isotropically removes material from the first and second dielectric layers 106 and 110, forming recessed first and second dielectric layers 402 and 404. In the exemplary embodiment, where lithographic techniques permit a trench 202 that is 80 nm across, the chemical oxide removal may be timed to remove about 10 nm of material. The etch of the dielectric layers 106 may be performed using, e.g., a buffer hydrogen fluoride etch or a chemical oxide etch that uses a gaseous, plasma-damage-free etch with a mixture of hydrogen fluoride and ammonia in a ratio of approximately 2:1. The hardmask plug 302 helps prevent the chemical oxide removal from affecting the masking layer 104.

Figure 5:
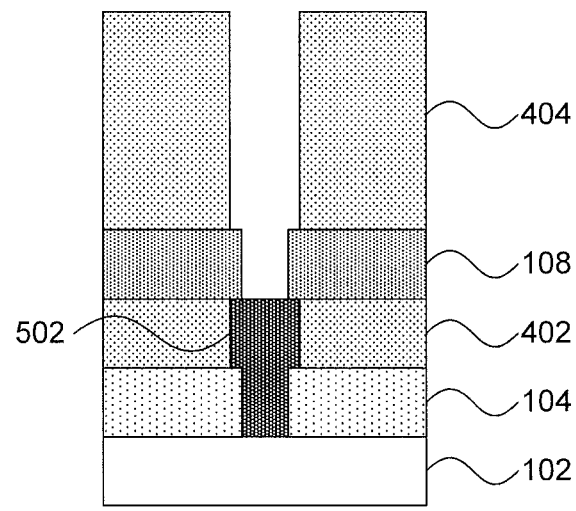
FIG. 5 is a cross-sectional view of a step in forming high-density fin structures in accordance with the present principles.

Referring now to FIG. 5, a step in producing high-density structures is shown. Additional hardmask material is spun on, which is then etched down to the etched first dielectric layer 402, producing extended hardmask 502.

Figure 6:
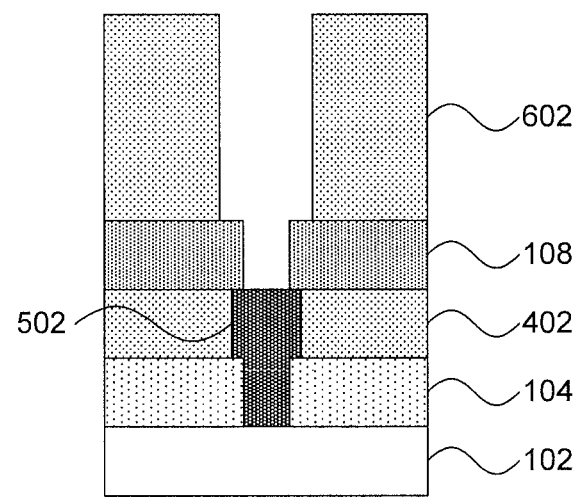
FIG. 6 is a cross-sectional view of a step in forming high-density fin structures in accordance with the present principles.

Referring now to FIG. 6, a step in producing high-density structures is shown. A further step of chemical oxide removal is performed on the etched second dielectric layer 404, producing a further etched second dielectric layer 602. As a result of this second chemical oxide removal, the second dielectric layer 602 is recessed further than the first dielectric layer 402. In an exemplary embodiment, this etch may remove about 10 nm of material from the second dielectric layer 602.

Figure 7:
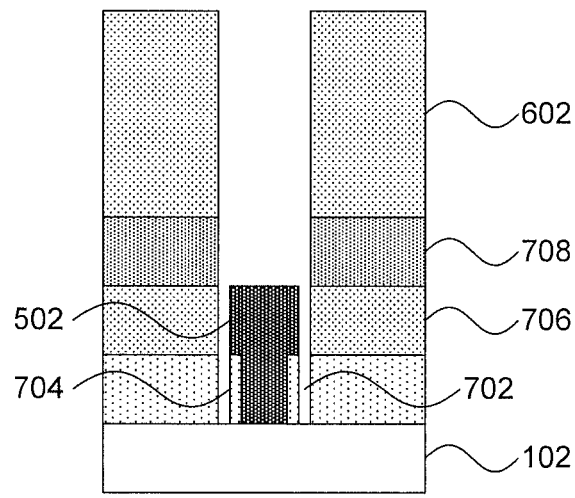
FIG. 7 is a cross-sectional view of a step in forming high-density fin structures in accordance with the present principles.

Referring now to FIG. 7, a step in producing high-density structures is shown. An anisotropic etch, such as reactive ion etching, is performed around the hardmask 502. The etched first dielectric layer 402 is etched along with the masking layer 104 and the hardmask layer 108, such that etched first dielectric layer 706 is even with etched second dielectric layer 602 and the etched masking and hardmask layers 104 and 708 are pulled back. This etch forms trenches 702 on either side of the hardmask 502, with a small amount of masking layer 704 left underneath the overhang of the hardmask 502.

Figure 8:
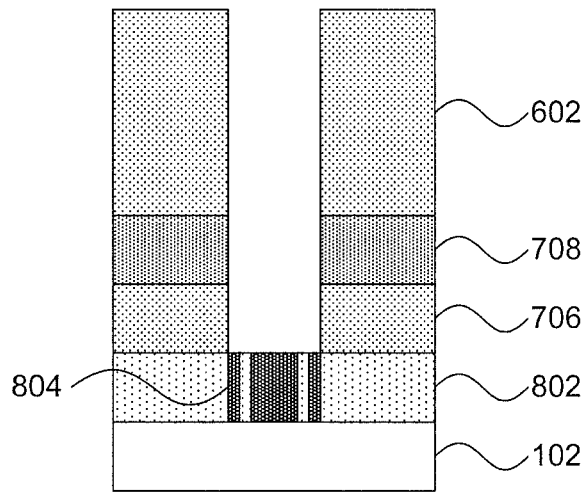
FIG. 8 is a cross-sectional view of a step in forming high-density fin structures in accordance with the present principles.

Referring now to FIG. 8, a step in producing high-density structures is shown. Additional hardmask material is spun on, filling the trenches 702, and is then etched down to the level of masking layer 802. This forms hardmask fins 804 on the substrate 102.

Figure 9:
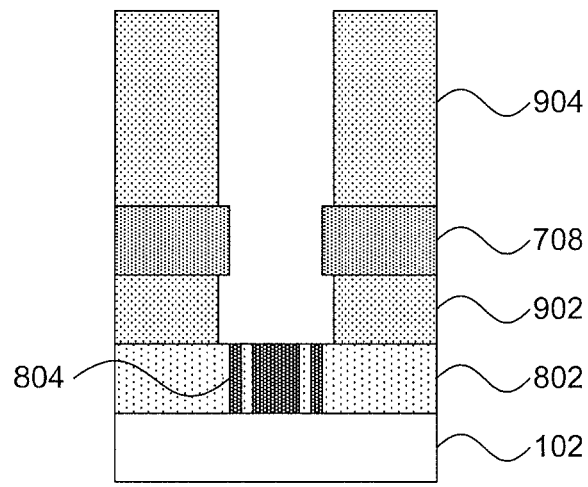
FIG. 9 is a cross-sectional view of a step in forming high-density fin structures in accordance with the present principles.

Referring now to FIG. 9, a step in producing high-density structures is shown. The dielectric layers are etched using a chemical oxide removal that, in one exemplary embodiment, removes 10 nm of material. This leaves recessed first and second dielectric layers 902 and 904.

Figure 10:
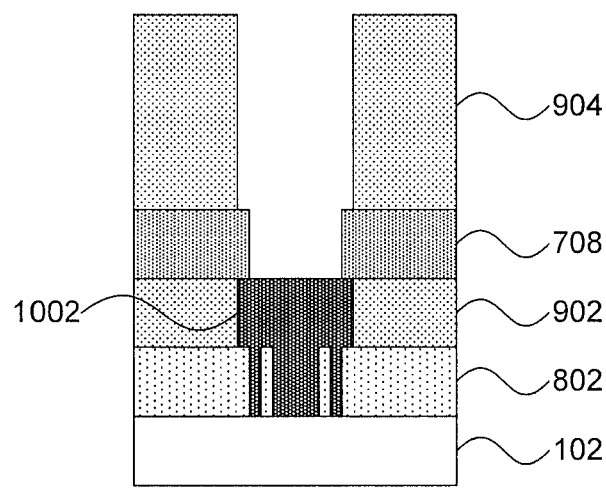
FIG. 10 is a cross-sectional view of a step in forming high-density fin structures in accordance with the present principles.

Referring now to FIG. 10, a step in producing high-density structures is shown. Additional hardmask material is spun on and etched down to the level of the first dielectric layer 902, creating hardmask plug 1002.

Figure 11:
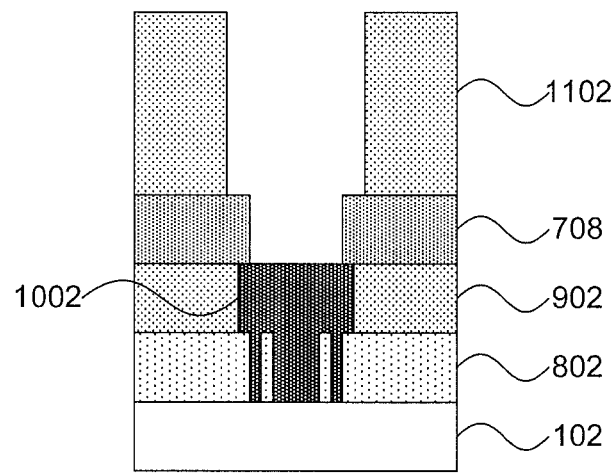
FIG. 11 is a cross-sectional view of a step in forming high-density fin structures in accordance with the present principles.

Referring now to FIG. 11, a step in producing high-density structures is shown. A further chemical oxide removal is performed, removing an isotropic layer of material to produce recessed second dielectric layer 1102. In one exemplary embodiment, this removes another 10 nm of material from all surfaces of the second dielectric layer 1102.

Figure 12:
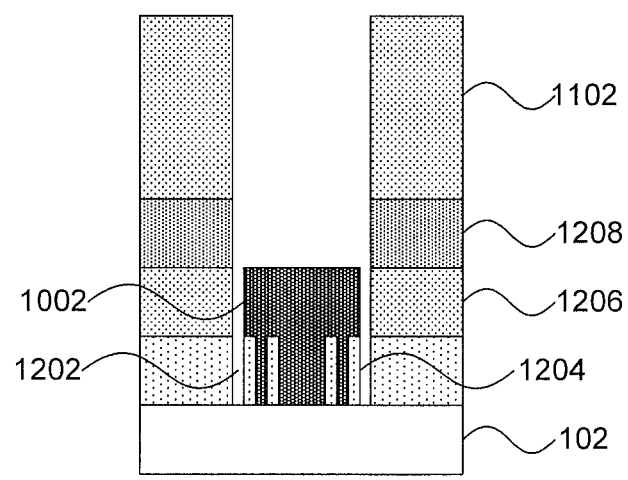
FIG. 12 is a cross-sectional view of a step in forming high-density fin structures in accordance with the present principles.

Referring now to FIG. 12, a step in producing high-density structures is shown. An anisotropic etch, such as reactive ion etching, is performed around the hardmask 1002. The etched first dielectric layer 902 is etched along with the masking layer 802 and the hardmask layer 1208, such that etched first dielectric layer 1206 is even with etched second dielectric layer 1102 and the etched masking and hardmask layers 802 and 1208 are pulled back. This etch forms trenches 1202 on either side of the hardmask 1002, with a small amount of masking layer 1204 left underneath the overhang of the hardmask 1002.

The steps shown in FIGS. 8-12 can be repeated an arbitrary number of times, adding additional fins of masking material and hardmask material with each iteration. With each iteration, the isotropic chemical oxide removal decreases the thickness of the second dielectric layer 110. In the exemplary embodiments described above, this means that at least 10 nm of material would be needed for every iteration. With that in mind, the initial formation of the second dielectric layer 110 is performed in accordance with the total number of fins to be formed.

Figure 13:
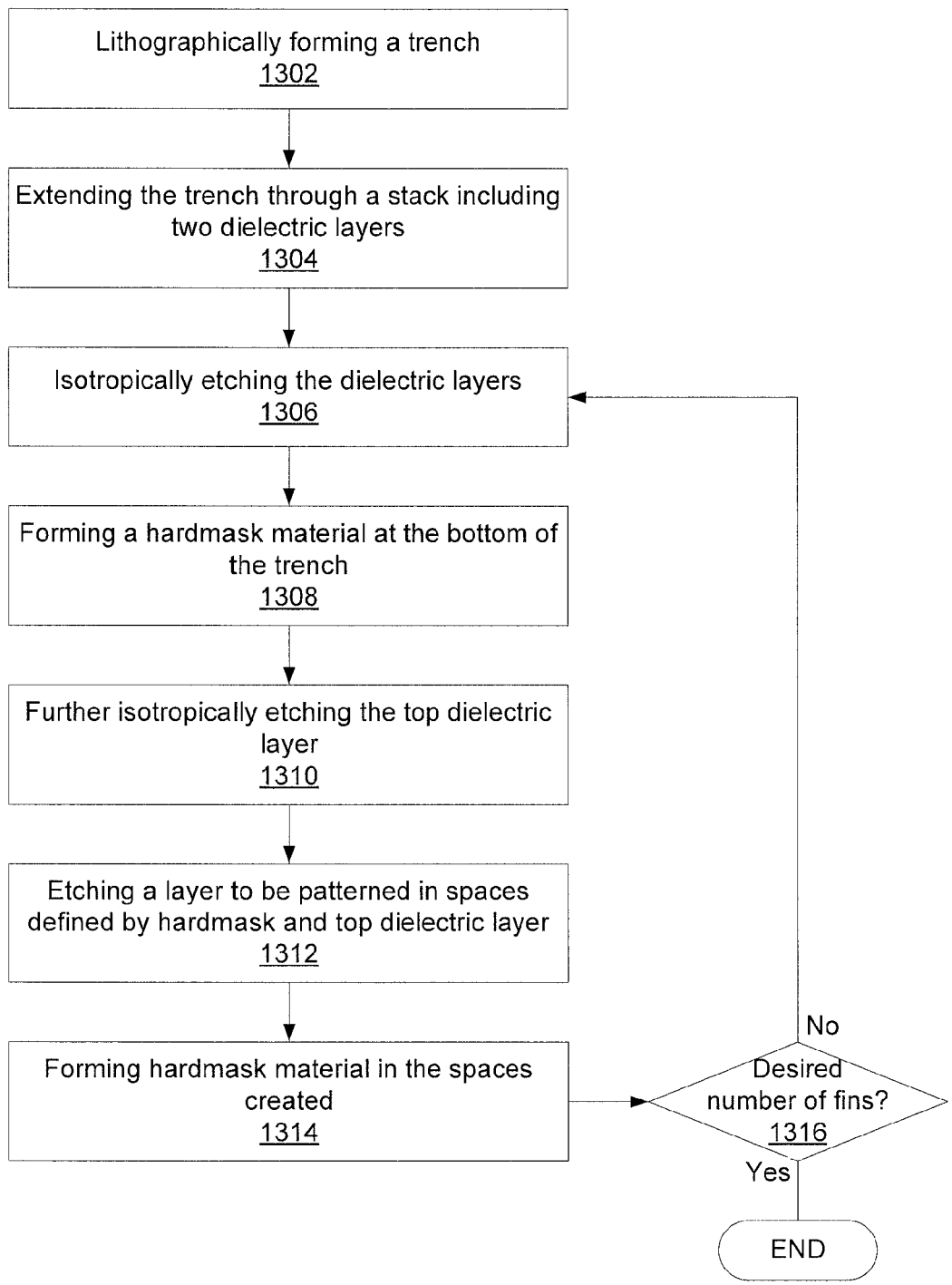
FIG. 13 is a block/flow diagram of a method for forming high-density fin structures in accordance with the present principles.

Referring now to FIG. 13, a method for producing high-density structures is shown. Block 1302 lithographically forms a trench on top of a stack, as shown above in FIG. 1. The trench is formed initially in a lithographic mask 112. Block 1304 then extends the trench down through the stack to the substrate 102. Block 1306 isotropically etches the two dielectric layers, such that they're recessed with respect to intervening and underlying layers.

Block 1308 forms a hardmask plug 502 by spinning on hardmask material. In the above embodiments, this is described as being a two-step process, where the hardmask material is first etched down to the level of the layer to be patterned 104 before the isotropic etch of block 1306. In an alternative embodiment, the hardmask material can be filled up to the level of the bottom two layers in a single step, as shown in block 1308. Block 1310 then further isotropically etches the top dielectric layer 404, using the hardmask plug 502 to prevent the etch from reaching the lower dielectric layer 402.

Block 1312 uses the plug 502 and the recessed top dielectric layer 602 to etch down to the substrate layer 102, forming trenches 702 and fins 704. Block 1314 fills hardmask material in the trenches, extending the hardmask plug to the sidewalls. The plug can then be etched down to the level of the layer to be patterned. If block 1316 determines that are more fins to be etched, processing returns to block 1306. Otherwise, processing ends.

Figure 14:
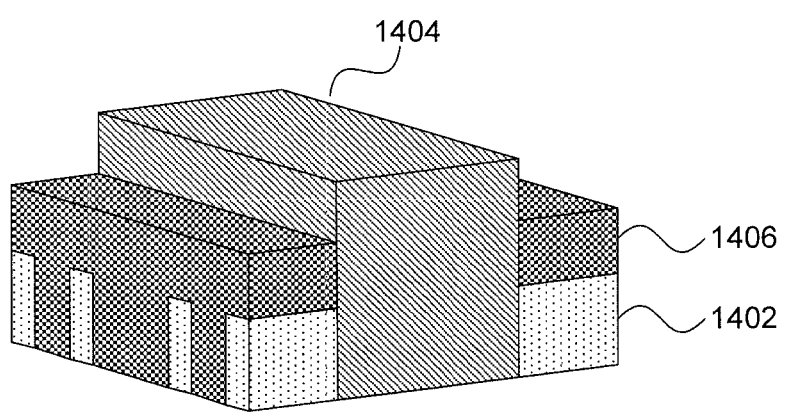
FIG. 14 is a perspective diagram of a semiconductor device including high-density fin structures in accordance with the present principles.

Referring now to FIG. 14, a step in producing semiconductor devices using the above high-density structures is shown. The fins 1402 that are formed using the present embodiments are tightly pitched. A gate 1404 may be formed over the fins 1402 and may include other structures, such as a gate dielectric, gate sidewalls, and fin hardmask material (not shown). The fins 1402 may be merged in source and drain regions 1406 to form a single electrode on either side of the gate 1404. In this way, the advantages of having narrow channels can be maximized, using multiple narrow fins in a single transistor. The fins 1402 that are under the gate 1404 form a set of channel regions for a single transistor having shared source and drain regions. The source and drain regions 1406 may be doped or made conductive by the formation of a silicide to form an electrical connection between the fins 1402.

Having described preferred embodiments of semiconductor devices and sidewall image transfer methods with spin-on hardmasks for forming the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming fins, comprising:
   forming a trench through a stack of layers that includes a top and bottom insulator layer, and a layer to be patterned on a substrate;
   isotropically etching the top and bottom insulator layers;
   forming a hardmask material in the trench to the level of the bottom insulator layer;
   isotropically etching the top insulator layer;
   etching the bottom insulator layer and the layer to be patterned down to the substrate to form fins from the layer to be patterned;
   forming a hardmask material in the trench to the level of the layer to be patterned; and
   repeating both of said steps of forming hardmask material in the trench and both of said steps of isotropically etching until a predetermined number of fins have been formed.

2. The method of claim 1, wherein etching the bottom insulator layer and the layer to be patterned comprises anisotropically etching said layers in regions defined by the hardmask material and the top insulator layer.

3. The method of claim 1, further comprising forming a hardmask material in the trench to the level of the layer to be patterned.

4. The method of claim 3, further comprising repeating said steps of forming hardmask material and isotropically etching until a predetermined number of fins have been formed.

5. The method of claim 1, wherein the top insulator layer is formed with a thickness greater than twice an isotropic etch depth for each set of fins to be produced.

6. The method of claim 1, wherein forming the trench comprises lithographically forming a trench in a lithographic mask layer on the top insulator layer.

7. The method of claim 1, wherein isotropically etching an insulator layer in both of said isotropic etching steps comprises performing a chemical oxide removal that removes an equal amount of insulator material from every exposed surface of the insulator layer.

8. The method of claim 1, wherein forming the hardmask material comprises spinning the hardmask material on and etching until the hardmask material reaches a specific level.

9. The method of claim 8, wherein the hardmask material comprises hafnium oxide and etching the hardmask material uses a SiF6/02 plasma.

10. A method for forming fins, comprising:
    forming a trench through a stack of layers that includes a top and bottom insulator layer, and a layer to be patterned on a substrate;
    forming a hardmask material in the trench to the level of the layer to be patterned;
    isotropically etching the top and bottom insulator layers;
    forming a hardmask material in the trench to the level of the bottom insulator layer;
    isotropically etching the top insulator layer;
    etching the bottom insulator layer and the layer to be patterned down to the substrate to form fins from the layer to be patterned; and
    repeating both of said steps of forming hardmask material and both of said steps of isotropically etching until a predetermined number of fins have been formed.

11. The method of claim 10, wherein etching the bottom insulator layer and the layer to be patterned comprises anisotropically etching said layers in regions defined by the hardmask material and the top insulator layer.

12. The method of claim 10, wherein the top insulator layer is formed with a thickness greater than twice an isotropic etch depth for each set of fins to be produced.

13. The method of claim 10, wherein forming the trench comprises lithographically forming a trench in a lithographic mask layer on the top insulator layer.

14. The method of claim 10, wherein isotropically etching an insulator layer in both of said isotropic etching steps comprises performing a chemical oxide removal that removes an equal amount of insulator material from every exposed surface of the insulator layer.

15. The method of claim 10, wherein each step of forming the hardmask material comprises spinning the hardmask material on and etching until the hardmask material reaches a specific level.

16. The method of claim 15, wherein the hardmask material comprises hafnium oxide and etching the hardmask material uses a SiF6/02 plasma.

* * * * *